(12) United States Patent
Stanculescu

(10) Patent No.: US 7,930,690 B1
(45) Date of Patent: Apr. 19, 2011

(54) VARIABLE PRECISION COMPUTATION

(76) Inventor: Alexandru G Stanculescu, San Mateo, CA (US)

( * ) Notice: Subject to any disclaimer, the term of this patent is extended or adjusted under 35 U.S.C. 154(b) by 1220 days.

(21) Appl. No.: 11/582,280

(22) Filed: Oct. 16, 2006

(51) Int. Cl.
*G06F 9/44* (2006.01)
*G06F 9/45* (2006.01)

(52) U.S. Cl. .......................................... 717/162; 717/136

(58) Field of Classification Search .................. 717/105, 717/146, 155, 157, 107, 109, 136, 162; 703/13, 703/14; 716/1, 17; 709/246; 715/700; 712/245; 345/619
See application file for complete search history.

(56) References Cited

U.S. PATENT DOCUMENTS

| | | | |
|---|---|---|---|
| 6,857,118 B2* | 2/2005 | Karr et al. ...................... | 717/114 |
| 2002/0120914 A1* | 8/2002 | Gupta et al. ...................... | 716/17 |
| 2007/0061721 A1* | 3/2007 | Bustelo et al. ................ | 715/705 |

OTHER PUBLICATIONS

Henry Levy, "Early Descriptor Architectures", Capability-Based Computer Systems, chp. 2, Digital Press 1984, pp. 1-21 <EarlyDescriptors.pdf>.*
Mathworks Symbolic Math Tool Box User's Guide, pp. 3-4, Variable Precision, 1993-2010 pp. 1-243.
Mathworks, Mat Lab User's Guide Matlab Compiler 4, 1996-2010, pp. 1-246.
OSCI—2003, Systemic User's Guide Mar. 2006 pp. 169, Data Types; pp. 1-221.
Mentor Graphics, Jun. 27, 2006, New Bit-Accurate CH-Data Types That Accelerate Algorithm Validation by IOX, pp. 1-2.
Fintronic USA, Jul. 21, 2006, Super FinSim Supports Variable Precision Fixed and Flastcuy Point Computations in Veriloy, p. 1-2.

* cited by examiner

*Primary Examiner* — Tuan Anh Vu

(57) ABSTRACT

The present invention provides a method and system for describing variable precision computations without needing explicit conversion functions in case operands have different formats or sizes of fields, having the capability to modify at run time the sizes of the fields of any variable precision data object, as well as having access to special condition signals associated to each object in which results are stored.

2 Claims, No Drawings

VARIABLE PRECISION COMPUTATION

BACKGROUND OF THE INVENTION

Definition of Terms

1. Process description: code written in a language that can be processed by a computer, which sets the values of objects (referred to in general as signals and more specifically as wires, registers, variables, or nets) and which is executed whenever there is a change in the value of one of the objects listed in the sensitivity list of the given process.

2. Hardware Description Language or HDL: language that can be processed by a computer and that supports the description of electronic circuits for the purpose of predicting its behavior or for the purpose of creating the actual circuit from such a description. An HDL must have the capability of describing processes.

3. Digital simulation: simulation of a hardware description provided in an HDL where values of the individual bits are being modeled as having two states (0, 1), three states (0, 1, x) or four states (0,1, x, or Z), and possibly having strength associated to such states.

4. Front end: program that reads the HDL description provided by the user and produces code that when executed simulates the HDL description.

5. Back End: program comprising the code generated by the front end and code that is common to all simulations, also known as kernel.

6. Run time or runtime: the period of time during which the back end simulates the circuit. "At run time" means during the execution of the back end.

7. Abstraction-level: HDL descriptions are said to be at certain abstraction levels: transistor-level, gate-level, rtl-level, behavioral-level. Rtl-level and behavioral-level are said to be above gate-level.

8. Arithmetic operators: operators which include addition (+), subtraction (−), multiplication ("), division (/), power ("*), modulo (%).

9. Logical operators: operators which include "less than" (Lt, or <), "less or equal" (Le, <=), "greater than" (Gt, >), "greater or equal" (Ge, >=), "not equal" (Ne, or !=), "equal" (Eq, ==).

10. Value: rational number represented by various bits whose meaning is indicated by the associated information of format and sizes.

11. Floating Point representation or format: manner in which a value is represented as exponent sign and mantissa as described by Standard IEEE 854.

12. Fixed Point representation or format: the meaning of the corresponding bits is two's complement, sign-magnitude, or fixed bcd.

13. Two's complement: representation comprising two concatenated series of bits, i.e. the integer part and the fractional part, with the most significant bits being the integer part. The sign of a value is given by the most significant bit of the integer part, with the value 1 corresponding to negative and 0 to positive. Positive numbers have as value the integer part viewed as an integer plus the sum of products between the value of the i-th bit of the fractional part counting from the most significant and $2^{**}(-i)$, with the first bit being counted as 1. Negative values are obtained from their positive counterparts by taking the two's complement of the entire concatenation of the integer and fractional parts.

14. Sign-magnitude: representation comprising three concatenated parts:
(i) sign, consisting of one bit, with the value 1 representing negative and 0 positive,
(ii) integer part, and (ii) fractional part.

15. Right Hand Side or RHS: expression occurring on the right hand side of an assignment, e.g. of the "=" sign.

16. Left Hand Side or LHS: expression occurring on the left of an assignment, i.e. the target of the assignment.

17. Variable Precision Descriptor: data container able to contain all the information necessary to process the data to which the descriptor is associated. Information stored in the descriptor includes: format of the data, sizes of the fields of the format, rounding options, overflow options, miscellaneous data regarding level of warnings, etc.

18. Variable Precision Data Object: data container that contains a handle to the associated descriptor and a number of bits that represent a value and which must be interpreted according to the information in the descriptor.

19. vp-data: is another appellation for Variable Precision Data Object.

20. sensitivity list: list of HDL supported objects whose change in value triggers the execution of the process that is sensitive to this sensitivity list.

21. Implicit info object: HDL object, i.e. of one of the types supported by the HDL, that is associated by the front end to a Variable Precision Data Object and that the user can reference in reading it, writing to it and using it in sensitivity lists, without having to declare it.

22. GUI: Graphical user interface.

23. API: Access Procedural Interface

FIELD THE INVENTION

Digital simulation at an abstraction level above gate-level may use arithmetic or logic operators as well as system functions to model computations that are performed by the given circuit. The results of such computations depend on the representation of the values within the operands, i.e. the format used (e.g. floating point or fixed point) and the number of bits of the fields of the given format.

In general it is best to use the appropriate number of bits for the representation of operands involved in computations. More bits than necessary will use too much power and fewer bits than necessary will introduce quantization errors that may be unacceptable for the correct behavior of the circuit.

Prior to this invention designers could insert in their hardware description language calls to pre defined functions that would perform the required computation using the appropriate format and precision and then perform simulations using this predefined functions. In case one operand does not have the appropriate format or size a conversion function could be called that would transform the given operand into an operand of the appropriate format and size.

Therefore, prior to this invention, the task of finding out the best formats and sizes for each operand was very time consuming since either explicit code for each kind of format and size needed to be inserted in the HDL simulation or numerous simulation performed, each with a different format or size for some operands.

For example, based on this invention the designer can write in Verilog HDL expressions involving operands of various formats having sizes which can be modified during the execution of the simulation. Also, there is no need for using explicit conversion functions, or system functions for operations such as addition, subtraction, multiplication, division, power, remainder, modulo, for which there are operators in Verilog HDL.

Having the capability of modifying the format or number of bits used during the simulation makes it possible to find out the ideal format and number of bits for each operand, without human intervention in the optimization loop. Also, this capability allows to model hardware that is designed to change the formats and the number of bits of the operands during the execution of their functionality.

BACKGROUND ART

1. MatLab, the program being sold by MathWorks, supports the description of expressions and their evaluation, where the operands have a given number of bits. Such expressions can be simulated within a Verilog simulator using Simulink. However, the sizes of the operand representation may not be modified to a specific value, nor the format of the representation changed at run time without human intervention (see reference 2).

2. The companion of MatLab, the Symbolic Math Tool Box (see reference 1), contains a function named vpa (for variable precision arithmetic) which accepts as inputs an expression e and a number d, and returns a value r that contains the value of the expression with d correct digits of fractional part.

First, we must notice that the number of correct digits produced by the function vpa does not guarantee the use of a certain number of bits for mantissa/exponent or integer/fractional part of the operands of the expression e even for simple two-operand expressions. Evidently the number of bits used in order to produce d correct digits of fractional part depends on the value of the operands of expression e. Therefore using this approach one cannot evaluate an expression where the operands have sizes of their fields modified to exact values during the execution of the program without human intervention. It follows that the use of the vpa function in the Symbolic Math Tool Box does not provide any of the solutions claimed by this invention.

3. U.S. Pat. No. 6,857,118, assigned to Mathworks teaches how function calls containing other function calls as arguments can be processed more efficiently. This patent does not teach how to implement any of the features claimed by this invention. Specifically, it does not teach how to change sizes of operands at runtime without human intervention, how to associate implicit info objects to variable precision data objects, how to support operators that accept operands of different formats and sizes, and how to support overloading of assignments.

4. SystemC supports a library providing fixed point arithmetic computations for various sizes of operands (see reference 3). However, this library does not support any of the features claimed by this invention.

5. Mentor Graphics made an announcement (see reference 4) in June 2006 regarding the release of a C/C++ library supporting computations with desired precision. However, that announcement does not make any of the claims made by this invention.

6. Fintronic USA, Inc. made an announcement on Jul. 21, 2006 (see reference 5) regarding support by Super FinSim of Variable Precision Fixed Point and Floating Point Computations. The announcement by Fintronic USA, Inc. tells what Super FinSim, Fintronic's Verilog simulator can achieve by using the present invention. However, neither the announcement nor the documentation teaches anything about the embodiment supporting the claims made by this invention.

SUMMARY OF THE INVENTION

The present invention provides a method and system for describing variable precision computations without needing explicit conversion functions and supporting access to special condition signals associated to each object where results will be stored.

This is achieved by (1) allowing the user to: (a) mark some objects as variable precision data objects, (b) mark some objects as descriptors, (c) associate descriptors to each of the data objects, (d) set the fields of the descriptors to appropriate values, (e) use supported operators and functions that accept variable precision data objects, and (2) by having the front end (i) convert literals into variable precision data objects, (ii) insert conversion functions between variable precision data objects and other data types, and (3) by having in the simulator functions that can accept variable precision data objects of any of the supported formats, e.g. floating point, floating point with no denormals, two's complement, sign magnitude, two's complement with negative sizes, floating point bcd, etc.

DETAILED DESCRIPTION OF THE INVENTION

Preferred Embodiment

The present invention is directed to a method and apparatus supporting variable precision computations in Hardware Description Languages. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown, but is to be accorded the widest scope consistent with the principles and features described herein.

According to the present invention, variable precision computation is made possible by having the user specify variable precision data objects and descriptors and associate descriptors to data objects. In doing so, enough information is available at run time when computations are performed on the data objects and their associated descriptors so that the computations can be carried on as specified. Also, the capability of accessing implicit info objects permits to access overflow or underflow information as well as to maintain the cumulative error associated to each data object, which in turn leads to the capability to distinguish between correct special conditions (e.g. overflow and underflow which would occur irrespective of the number of bits used during the computation) and erroneous special conditions (e.g. underflow or overflow which may occur due to quantization errors.

One skilled in the relevant art, however, will readily recognize that the invention can be practiced in slightly different way, without one or more of the specific details, or with other methods, etc. In other instances, well known structures or operations are not shown in detail to avoid obscuring the invention.

Example 1

Front End Transformation of Basic Variable Precision Related Code

Original Verilog Code with Variable Precision Computation:

```
/* format */
'define TWOS_COMPLEMENT 1
'define SIGN_MAGNITUDE 2
'define FLOATING 3
/*rounding */
'define TO_NEAREST_INTEGER_IF_TIE_TO_MINUS_INF 1
'define TO_NEAREST_INTEGER_IF_TIE_TO_PLUS_INF 2
'define TO_NEAREST_INTEGER_IF_TIE_TO_ZERO 3
'define JUST_TRUNCATE 4
'define TO_ZERO 5
'define TO_INF 6
'define TO_MINUS_INF 7
'define TO_PLUS_INF 8
/* overflow */
'define SATURATION 1
'define NORMAL 2
module top;
(* varprec = data */
reg [0:511] in1;
```

```
real f1;
(* varprec = descriptor *)
reg [0:1] d1;
initial begin
  $VpSetDescriptorInfo(d1, 150, 96, 'TWOS_COMPLEMENT,
           TO_NEAREST_INTEGER_IF_TIE_MINUS_INF,
           'SATURATION, 1);
  $VpSetDefaultOptions(256, 96, 'TWOS COMPLEMENT,
           TO_NEAREST INTEGER_IF_TIE_MINUS_INF,
           'SATURATION, 1);
  $VpAssocDescrToData(in1, d1);
  #10;
    f1 = 1.0e+3;
    int = 2.323e+3;
    int = in1/f1;
end
endmodule
```

```
module top( );
mode ( );
 initial begin
  in1_overflow = 0;
  in1_NrOfDecBitsLost = 0;
  in1_underflow = 0;
  in1_cummulativeError = 0;
  in1_PeakNrOfIntBitsUsed = 0;
  VPInitialAdjSizeOfReg(in1);
  VPSetDescriptorInfo(d1, 0,0,0,0,0,0);
  tmp_VP_1_Overflow = 0;
  tmp_VP_1_NrOfDecBitsLost = 0;
  tmp_VP_1_Underflow = 0;
  tmp_VP_1_CummulativeError = 0;
  tmp_VP_1_PeakNrOfIntBitsUsed = 0;
  VPInitialAdjSizeOfReg(tmp_VP_1);
  VpAssocDescrToData(tmp_VP_1, tmpD_VP_1);
 end
 reg [0:546] in1;
 reg [0:31] in1_Overflow;
 reg [0:31] in1_NrOfDecBitsLost;
 reg [0:31] in1_underflow;
 reg [0:31] in1_cummulativeError;
 reg [0:31] in1_PeakNrOfIntBitsUsed;
 reg [0:31] fin_tmp_Overflow;
 reg [0:31] fin_tmp_NrOfDecBitsLost;
 reg [0:31] fin_tmp_underflow;
 reg [0:31] fin_tmp_cummulativeError;
 reg [0:31] fin_tmp_PeakNrOfIntBitsUsed;
 reg f1;
 reg [0:127] d1;
 reg [0:99200] tmp_VP_1;
 reg [0:31] tmp_VP_1_Overflow;
 reg [0:31] tmp_VP_1_NrOfDecBitsLost;
 reg [0:31] tmp_VP_1_underflow;
 reg [0:31] tmp_VP_1_cummulativeError;
 reg [0:31] tmp_VP_1_PeakNrOfIntBitsUsed;
 reg [0:128] tmpD_VP_1;
 initial begin
  $VpSetDescriptorInfo(d1, 150, 96, 1, 1, 1, 1);
  $VpSetDefaultOptions(256, 96, 1, 1, 1, 1);
  $VpAssocDescrToData(in1, d1);
  #(10);
    f1 = 1.0e+3;
    in1    =    fstVpFI2VP(2.323e+3,    in1,    fin_tmp_Overflow,
        fin_tmp_NrOfDecBitsTruncated,
            fin_tmp_Underflow,
         fin_tmp_CummulativeError,    fin_tmp_PeakNrOfBitsUsed);
  begin
    fstVpSetDescrFrom0(tmp_VP_1);
    tmp_VP_1 = fstVpFI2Vp(f1, tmp_VP_1,                fin_tmp_Overflow,
           fin_tmp_NrOfDecBitsUsed,
           fin_tmp_Underflow,
           fin_tmp_CummulativeError,
           fin_tmp_PeakNrOfBitsUsed);
```

```
    begin
      fin_tmp_PeakNrOfBitsUsed = in1_PeakNrOfBitsUsed;
      in1 = $fstVpDiv(in1, tmp_VP_1, in1, 32'sb0,
        in1_CummulativeError,
32'sb0,
      tmp_VP_1_CummulativeError,
            fin_tmp_Overflow,
            fin_tmp_NrOfDecBitsUsed,
            fin_tmp_Underflow,
            fin_tmp_CummulativeError,
            fin_tmp_PeakNrOfBitsUsed);
      in1_Overflow = fin_tmp_Overflow;
      in1_NrOfDecBitsUsed = fin_tmp_NrOfDecBitsUsed;
      in1_Underflow = fin_tmp_Underflow;
      in1_CummulativeError = fin_tmp_CummulativeError;
      in1_PeakNrOfBitsUsed = fin_tmp_PeakNrOfBitsUsed;
    end
   end
  end
endmodule
```

Example 2

Flattening of Complex Expressions in the Front End

Original Verilog Code with Variable Precision Computation Showing an Initial Statement in the Context of Example 1.

```
/* format */
'define TWOS_COMPLEMENT 1
'define SIGN_MAGNITUDE 2
'define FLOATING 3
/*rounding */
'define TO_NEAREST_INTEGER_IF_TIE_TO_MINUS_INF 1
'define TO_NEAREST_INTEGER_IF_TIE_TO_PLUS_INF 2
'define TO_NEAREST_INTEGER_IF_TIE_TO_ZERO 3
'define JUST_TRUNCATE 4
'define TO_ZERO 5
'define TO_INF 6
'define TO_MINUS_INF 7
'define TO_PLUS_INF 8
/* overflow */
'define SATURATION 1
'define NORMAL 2
```

```
                                32'sb0,
                     32'sb0,
```

```
module top;
(* varprec = data */)
reg [0:511] in1;
real f1;
(* varprec = descriptor *)
reg ]0:1] d1;
initial begin
  $VpSetDescriptorInfo(d1, 150, 96, 'TWOS_COMPLEMENT,
         TO_NEAREST_INTEGER_IF_TIE_MINUS_INF,
         'SATURATION, 1);
  $VpSetDefaultOptions(256, 96, 'TWOS_COMPLEMENT,
         TO_NEAREST_INTEGER_IF_TIE_MINUS_INF,
         'SATURATION, 1);
  $VpAssocDescrToData(in1, d1);
  #10;
  int = 2323;
  if (in1/1000 > 2.1)
    $display("OK\n");
  else
    $display("Error\n");
end
endmodule
```

Code Produced by the Front End by Transforming the Original Verilog Code of Example 2.

```
module top( );
  mode ( );
   initial begin
     in1_overflow = 0;
     in1_NrOfDecBitsLost = 0;
     in1_underflow = 0;
     in1_cummulativeError = 0;
     in1_PeakNrOfIntBitsUsed = 0;
     VPInitialAdjSizeOfReg(in1);
     VPSetDescriptorInfo(d1, 0,0,0,0,0,0);
     tmp_VP_0_Overflow = 0;
     tmp_VP_0_NrOfDecBitsLost = 0;
     tmp_VP_0_Underflow = 0;
     tmp_VP_0_CummulativeError = 0;
     tmp_VP_0_PeakNrOfIntBitsUsed = 0;
     VPInitialAdjSizeOfReg(tmp_VP_1);
     VpAssocDescrToData(tmp_VP_0, tmpD_VP_0);
        tmp_VP_1_Overflow = 0;
     tmp_VP_1_NrOfDecBitsLost = 0;
     tmp_VP_1_Underflow = 0;
     tmp_VP_1_CummulativeError = 0;
     tmp_VP_1_PeakNrOfIntBitsUsed = 0;
     VPInitialAdjSizeOfReg(tmp_VP_1);
     VpAssocDescrToData(tmp_VP_1, tmpD_VP_1);
```

```
        end
        reg [0:546] in1;
        reg [0:31] in1_Overflow;
        reg [0:31] in1_NrOfDecBitsLost;
        reg [0:31] in1_underflow;
        reg [0:31] in1_cummulativeError;
        reg [0:31] in1_PeakNrOfIntBitsUsed;
        reg [0:31] fin_tmp_Overflow;
        reg [0:31] fin_tmp_NrOfDecBitsLost;
        reg [0:31] fin_tmp_underflow;
        reg [0:31] fin_tmp_cummulativeError;
        reg [0:31] fin_tmp_PeakNrOfIntBitsUsed;
        reg f1;
        reg [0:127] d1 ;
        reg [0:99200] tmp_VP_0;
        reg [0:31] tmp_VP_0_Overflow;
        reg [0:31] tmp_VP_0_NrOfDecBitsLost;
        reg [0:31] tmp_VP_0_underflow;
        reg [0:31] tmp_VP_0_cummulativeError;
        reg [0:31] tmp_VP_0_PeakNrOfIntBitsUsed;
        reg [0:128] tmpD_VP_0;
        reg [0:99200] tmp_VP_1;
        reg [0:31] tmp_VP_1_Overflow;
        reg [0:31] tmp_VP_1_NrOfDecBitsLost;
        reg [0:31] tmp_VP_1_underflow;
        reg [0:31] tmp_VP_1_cummulativeError;
        reg [0:31] tmp_VP_1_PeakNrOfIntBitsUsed;
        reg [0:128] tmpD_VP_1;
        reg [0:0] tmp_VP_1_Bit_1;
        initial begin
         $VpSetDescriptorInfo(d1, 150, 96, 1, 1, 1, 1);
         $VpSetDefaultOptions(256, 96, 1, 1, 1, 1);
         $VpAssocDescrToData(in1, d1);
         #(10);
         begin
          fin_tmp_PeakNrOfBitsUsed = in1_PeakNrOfBitsUsed;
          in1 = fstVpAssign(0, 0, 2323, 0, in1 , fin_tmp_Overflow,
             fin_tmp_NrOfDecBitsTruncated,
               fin_tmp_Underflow, fin_tmp_CummulativeError,
               fin_tmp_PeakNrOfBitsUsed);
          in1_Overflow = fin_tmp_Overflow;
          in1_NrOfDecBitsUsed = fin_tmp_NrOfDecBitsUsed;
          in1_Underflow = fin_tmp_Underflow;
          in1_CummulativeError = fin_tmp_CummulativeError;
          in1_PeakNrOfBitsUsed = fin_tmp_PeakNrOfBitsUsed;
         end
         begin
          fstVpSetDescrFrom1(in1, tmp_VP_0, 7);
          begin
           fin_tmp_PeakNrOfBitsUsed = in1_PeakNrOfBitsUsed;
           tmp_VP_0 = $fstVpDiv(in1, 1000, tmp_VP_0, 32'sb0,
             32'sb0,in1_CummulativeError,32'sb00000000000000000000000000100000,32'sb0,
             32'sb0, fin_tmp_Overflow,
               fin_tmp_NrOfDecBitsUsed,
               fin_tmp_Underflow,
               fin_tmp_CummulativeError,
               fin_tmp_PeakNrOfBitsUsed);
           tmp_VP_0_Overflow = fin_tmp_Overflow;
           tmp_VP_0_NrOfDecBitsUsed = fin_tmp_NrOfDecBitsUsed;
           tmp_VP_0_Underflow = fin_tmp_Underflow;
           tmp_VP_0_CummulativeError = fin_tmp_CummulativeError;
           tmp_VP_0_PeakNrOfBitsUsed = fin_tmp_PeakNrOfBitsUsed;
           fstSetDescrFrom0(tmp_VP_1, 18);
           tmp_VP_1 = fstVpFI2Vp(2.1, tmp_VP_1, fin_tmp_Overflow,
               fin_tmp_NrOfDecBitsUsed,
               fin_tmp_Underflow,
               fin_tmp_CummulativeError,
               fin_tmp_PeakNrOfBitsUsed);
           tmp_VP_1_Bit_1 = $fstVpGT(tmp_VP_0, tmp_VP_1, 32'sb0,
             32'sb0,tmp_VP_0_CummulativeError,32'sb0, 32'sb0,
             tmp_VP_1_CummulativeError);
           if (tmp_VP_1_Bit_1)
            $display("OK\n");
           else
            $display("Error\n");
          end
         end
        endmodule
```

Example 3

Front End Transformation in Support for Associating Implicit Objects

Original Verilog Code with Variable Precision Computation.

```
module top;
'include constants.v
(* varprec = data *)
reg [0:511] in1;
(* varprec = data *)
reg [0:511] in2;
(* varprec = data *)
reg [0:511] out;
real f1;
(* varprec = descriptor *)
reg [0:1] d1;
(* varprec = descriptor *)
reg [0:1] d2;
initial begin
    $VpSetDescriptorInfo(d1, 150, 96, 'TWOS_COMPLEMENT,
            TO_NEAREST_INTEGER_IF_TIE_MINUS_INF,
            'SATURATION, 1);
    $VpSetDefaultOptions(256, 96, 'TWOS_COMPLEMENT,
            TO_NEAREST_INTEGER_IF_TIE_MINUS_INF,
            'SATURATION, 1);
    $VpAssocDescrToData(in1, d1);
    $VpAssocDescrTData(in1, d1);
      $VpAssocDescrTData(in2, d1);
      $VpAssocDescrToData(out, d2);
        #(10);
        /* overflow at assignment to smaller part */
        $display("Overflow is expected:\n");
        in1 = 2323;
        in1 = in**10;
        out = in1;
        $display(out = %k\n", out);
    end
    always@(in1 Overflow)
    begin
        $display($time,, "int : Overflow occurred\n");
    end
endmodule
```

Code Produced by the Front End by Transforming the Original Verilog Code of Example 3:

```
module top( );
Mode( );
initial begin
    in1_overflow = 0;
    in1_NrOfDecBitsLost = 0;
    in1_underflow = 0;
    in1_cummulativeError = 0;
    in1_PeakNrOfIntBitsUsed = 0;
    VPInitialAdjSizeOfReg(in1);
    in2_overflow = 0;
    in2_NrOfDecBitsLost = 0;
    in2_underflow = 0;
    in2_cummulativeError = 0;
    in2_PeakNrOfIntBitsUsed = 0;
    VP InitialAdjSizeOfReg(in2);
    out_overflow = 0;
    out_NrOfDecBitsLost = 0;
    out_underflow = 0;
    out_cummulativeError = 0;
    out_PeakNrOfIntBitsUsed = 0;
    VPInitialAdjSizeOfReg(out);
        VPSetDescriptorInfo(d1, 0,0,0,0,0,0);
    VPSetDescriptorinfo(d2, 0,0,0,0,0,0);
    tmp_VP_1_Overflow = 0;
    tmp_VP_1_NrOfDecBitsLost = 0;
    tmp_VP_1_Underflow = 0;
    tmp_VP_1_CummulativeError = 0;
    tmp_VP_1_PeakNrOfIntBitsUsed = 0;
    VPInitialAdjSizeOfReg(tmp_VP_1);
    VpAssocDescrToData(tmp_VP_1, tmpD_VP_1);
end
reg [0:546] in1;
reg [0:31] in1_Overflow;
reg [0:31] in1_NrOfDecBitsLost;
reg [0:31] in1_underflow;
reg [0:31] in1_cummulativeError;
reg [0:31] in1_PeakNrOfIntBitsUsed;
reg [0:31] fin_tmp_Overflow;
reg [0:31] fin_tmp_NrOfDecBitsLost;
reg [0:31] fin_tmp_underflow;
reg [0:31] fin_tmp_cummulativeError;
reg [0:31] fin_tmp_PeakNrOfIntBitsUsed;
reg [0:546] in2;
reg [0:31] in2_Overflow;
reg [0:31] in2_NrOfDecBitsLost;
reg [0:31] in2_underflow;
reg [0:31] in2_cummulativeError;
reg [0:31] in2_PeakNrOfIntBitsUsed;
reg [0:546] out;
```

```
reg [0:31] out_Overflow;
reg [0:31] out_NrOfDecBitsLost;
reg [0:31] out_underflow;
reg [0:31] out_cummulativeError;
reg [0:31] out_PeakNrOfIntBitsUsed;
reg f1
reg [0:127] d1;
reg [0:127] d2;
reg [0:99200] tmp_VP_1;
reg [0:31] tmp_VP_1_Overflow;
reg [0:31] tmp_VP_1_NrOfDecBitsLost;
reg [0:31] tmp_VP_1_underflow;
reg [0:31] tmp_VP_1_cummulativeError;
reg [0:31] tmp_VP_1_PeakNrOfIntBitsUsed;
reg [0:128] tmpD_VP_1;
reg [0:0] tmp_VP_1_Bit_1;
initial begin
$VpSetDescriptorInfo(d1, 150, 96, 1, 1, 1, 1);
$VpSetDefaultOptions(256, 96, 1, 1, 1, 1);
$VpAssocDescrToData(in1, d1);
$VpAssocDescrToData(in2, d1);
$VpAssocDescrToData(out, d1);
#(10);
$display("Overflow is expected\n");
begin
   fin_tmp_PeakNrOfBitsUsed = in1_PeakNrOfBitsUsed;
   in1 = fstVpAssign(0,    0,    2323,    0,    in1,    fin_tmp_Overflow,
      fin_tmp_NrOfDecBitsTruncated,
         fin_tmp_Underflow,          fin_tmp_CummulativeError,
      fin_tmp_PeakNrOfBitsUsed);
   in1_Overflow = fin_tmp_Overflow;
   in1_NrOfDecBitsUsed = fin_tmp_NrOfDecBitsUsed;
   in1_Underflow = fin_tmp_Underflow;
   in1_CummulativeError = fin_tmp_CummulativeError;
   in1_PeakNrOfBitsUsed = fin_tmp_PeakNrOfBitsUsed;
 end
 begin
         fstVpSetDescrFrom0(tmp_VP_1, 17);
            begin
               fin_tmp_PeakNrOfIntBitsUsed tmp_VP_I_PeakNrOfBitsUsed;
               tmpVP1 = $fstVPAssign(0, 0, 10, 0, tmpVP1,
fin_tmp_Overflow, fin_tmp_NrOfDecBitsTruncated,       fin_tmp_UnderFlow,
fin_tmp_CummulativeError,       fin_tmp_PeakNrOfIntBitsUsed);
               tmp_VP_I_Overflow = fin_tmp_Overflow;
               tmp_VP_I_NrOfBitsLost = fin_tmp_NrOfDecBitsTruncated;
               tmp_VP_I_Underflow fin_tmp_UnderFlow;
               tmp_VP_I_CummulativeError = fin_tmp_CummulativeError;
             tmp_VP_I_PeakNrOfBitsUsed = fin_tmp_PeakNrOfIntBitsUsed; end
            begin
               fin_tmp_PeakNrOfIntBitsUsed = in1_PeakNrOfIntBitsUsed;
               m1 = $fstVPPow(in1, tmp_VP_1, m1, 32'sb0, 32sb0, in1_CummulativeError,
32'sb0, 32'sb0, tmp_VP_1_CummulativeError, fin_tmp_Overflow,
fin_tmp_NrOfDecBitsTruncated, fin_tmp_UnderFlow, fin_tmp_CummulativeError,
fin_tmp_PeakNrOfIntBitsUsed);
               in1_Overflow = fin_tmp_Overflow;
               in1_NrOfDecBitsLost fin_tmp_NrOfDecBitsTruncated; in1_Underflow =
fin_tmp_UnderFlow;
               in1_CummulativeError = fin_tmp_CummulativeError;
             in1_PeakNrOfIntBitsUsed = fin_tmp_PeakNrOfIntBitsUsed; end
        end
         begin
            fin_tmp_PeakNrOfIntBitsUsed = out_PeakNrOfIntBitsUsed;
            out $fstVpCopy(in1, out, 32'sb0, 32'sb0,
in1_CummulativeError, fin_tmp_Overflow,      fin_tmp_NrOfDecBitsTruncated,
fin_tmp_UnderFlow,          fin_tmp_CummulativeError,
fin_tmp_PeakNrOfIntBitsUsed);
            out_Overflow = fin_tmp_Overflow;
            out_NrOfDecBitsLost = fin_tmp_NrOfDecBitsTruncated;
            out_Underflow fin_tmp_UnderFlow;
            out_CummulativeError = fin_tmp_CummulativeError;
          out_PeakNrOfIntBitsUsed fin_tmp_PeakNrOfIntBitsUsed; end
         $display("out =%k\n", $getVPSBin(out));
      end
```

FE1: for each vp-data declaration encountered, it creates:
(i) a register having the number of bits specified by the Verilog description, plus the number of bits necessary to store a handle to the associated descriptor, plus the bits necessary for rounding. The number of bits necessary for rounding may be three bits as shown in this preferred embodiment or may be specified in one of numerous ways such as compiler directive, system task, compiler invocation option, etc.
(ii) a number of implicit registers, referred to also as associated implicit info objects. In this embodiment five implicit registers are associated to each vp-data object: Overflow, Underflow, CummulativeError, PeakNrOfBitsUsed, NrOfBitsLost. Example 3, shows how an associated implicit register can be referenced in the user's code.
(iii) inserts in an initial statement, which is going to be executed with higher priority than any of the user defined processes: statements that initialize the implicit registers, The transformations discussed in FE1 are exemplified in Example 1, and the code
can be found in the front end in smcVPCheckModFlatExprAndProcVpSF.

FE2: for each vp-descriptor declaration encountered, it creates a register declaration
having sufficient number of bits in order to support all the fields of the descriptor and
inserts in the "special" initial statement mentioned in FE1 a call to VPSetDescriptorInfo
having all the arguments set to the expected initial value. In this embodiment, six fields
of 32 bits each are supported for the descriptor, but other number of fields can be
supported in similar embodiments.

FE3: for each expression containing references to literals there is an implementation
choice of replacing the literal with a reference to a temporary register which has the
value of the literal assigned to it just before the evaluation of the expression or having
a way to inform the function evaluating the expression in the back end of the specific type of the data corresponding to the literal. To show both solutions in detail in this embodiment real-literals are assigned to temporaries and integer literals are converted to integers in an fstBundleT type, with at least on of two arguments relating to the sizes of the main argument being non-zero. In other words, the main argument of a function contains a vp-value only if at least one of the related two arguments has a non-zero value. The related arguments are named ini_SizeOfInt, ini_SizeOfDec for argument m1, and similarly in2_SizeOfInt, in2_SizeOfDec for argument in2 and the related code can be found in the back end functions such as fstVpAdd. Each temporary registers is allocated, a descriptor for it is allocated as well, and calls to VpAssocDescrToData are inserted in the "special" initial statement mentioned above in order to associate descriptors to the temporary registers.

FE4: for each expression that requires evaluations of one or more sub-expressions,
(i) temporary registers are allocated, descriptors are allocated for each temporary register, calls to VpAssocDescrToData are inserted in the "special" initial statement mentioned above in order to associate descriptors to the temporary registers,
(ii) the expression is transformed into a sequence of assignments to temporary registers, each one having as right hand side a simple expression consisting of either system function call or an operator applied to one or two operands and as lhs a temporary register or a user defined vp-data object. If the lhs is a temporary register, a call to a system task fstVpSetDescrFromN is inserted in front of the given assignment, where N can be 0, 1, or 2. The fstVpSetDescrFromN system tasks set the descriptor of the lhs of the next assignment to the appropriate values, with N signifying the number of arguments having descriptors which participate in the value of the lhs. The system task fstVpSetDescrFromN accepts as argument in addition of the lhs and of the operand containing a descriptor if N>0, also an argument indicating the kind of expression of the rhs. The descriptor of the lhs is going to be set to different value in case the expression on the rhs is an addition or a multiplication, although both may accept two vp-data objects. The insertion of fstVpSetDescrFromN is exemplified in Example 2 and 15 the actual fstVpSetDescrFrom0, fstVpSetDescrFrom1, and fstVpSetDescrFrom2 are shown in the code of the back end.

Both (i) and (ii) are exemplified in example 2, and the front end code that performs the transformations described in (i) and (ii) can be found in functions smcTopFlattenExpr and smcVpFlattenExpr, with the function smcVPProcessAssignment representing the general environment in which this transformation is performed.

The exact choice made by the preferred embodiment with respect to the values to be written in the descriptors of the temporary registers are only for the purpose of giving a complete description and other choices can be also acceptable and useful.

FE5: for each assignment encountered where the lhs is a vp-data the appropriate conversion function is inserted if necessary on the rhs:
(i) if the rhs is Verilog register its content is considered an integer value, no conversion function is inserted and the arguments SizeOfInt, SizeOfDec mentioned in FE3 are set accordingly,
(ii) if the rhs is a Verilog real the conversion function fstVpF12Vp is inserted and the appropriate arguments are passed to it, (iii) if the rhs is a vp-data then the fstVpCopy is inserted and the appropriate arguments are passed to it. Both (ii) and (iii) are exemplified in example 1 and the code performing this transformation is shown in the front end function called smcVPProcessAssignment.

FE6: for each assignment encountered where the lhs is a Verilog real, if the rhs is a vp-data the conversion function fstVp2FI is inserted, and the appropriate arguments are provided to the conversion. If the rhs is not a vp-data, no conversion function needs to be inserted, since literals are converted by the front end into the appropriate format. The function fstVp2FI can be found in the back end. It converts the value of any vp-data object into a double, which is the format supported for the Verilog type real in this particular implementation of Verilog. Other formats for the Verilog type real are possible and a different choice would just lead to minor modifications of the function fstVp2FI.

FE7: each assignment statement is accompanied by the setting of the implicit registers associated to the left hand side of the assignment, be it user defined vp-data object or temporary register. This is done by passing as input arguments of the evaluation functions along with the obvious input data, also the implicit input registers associated to the obvious input data. For example, fstVpAdd will have as arguments not only m1 and in2 the two vp-data objects to be added and in3 the vp-data object into which the result shall be placed, but also:
(i) SizeOfInt and SizeOfDec for each in1 and in2 as discussed in FE5, (ii) CummulativeError for each of in1 and in2, and (iii) overflow, underflow, nrOfBitsLost, cummulativeError, and PeakNrOfBitsUsed for in3. Also, when new values are assigned to implicit registers associated to vp-data objects, all processes that are sensitive to these implicit registers must be executed. There are many ways in which this can be implemented. In the present preferred embodiment, the choice is made to compute the values of the implicit registers in some temporary variables and then assign these temporary values to the actual implicit registers via a standard mechanism in the simulator which will ensure that all processes sensitive to these implicit registers will be executed. Some implicit registers such as in1_cummulativeError and in2_cummulativeError are inputs to fstVpAdd. Other implicit registers such as in3_overflow and in3_underflow are outputs of fstVpAdd. The implicit register in3_PeakNrOfBitsUSed is both an input and an output as it keeps the maximum number of bits used that was encountered throughout the simulation.

In order to support arithmetic operations between vp-data objects having different formats and sizes the back end provides appropriate functions for each supported operator that first perform appropriate conversion bringing the operands to the same size and 20 format and then performs the operation using functions which are available outside the scope of this invention. There are several possible choices for finding a common format and sizes into which to transform both operands. In this preferred embodiment the choice was made to choose the format and sizes such that during the conversions and internal operation (i.e. before performing the assignment of the internal value to the result), the highest priority shall be given to not getting an overflow which would not have been obtained anyways, second to not getting an underflow which would not have been obtained anyway, then to getting a result which after rounding would be as close to the ideal result (having infinite number of bits available) as possible. Actual complete implementations of these functions are exemplified in the back end in functions fstVpAdd, fstVpMult, fstVpDiv. Note that fstVpSub is very similar to fstVpAdd and has therefore been omitted for the sake of clarity.

In order to support comparison operations between vp-data objects having different formats and sizes the back end provides appropriate functions for each supported operator that first perform appropriate conversion bringing the operands to the same size and format and then performs the comparison operation using functions which are available outside the scope of this invention. There are several possible choices for finding a common format and sizes into which to transform both operands. In this preferred embodiment the choice was made to choose the format and sizes such that during the conversion made there should be no overflow or underflow. As a second priority the choice was made whenever possible to not to loose any bits of information of the value of the value to be converted. Actual complete implementations of these functions are exemplified in the back end in functions fstVpGE, fstVpLE, fstVpGT, fstVpLT, fstVpNE, fstVpEQ.

APPENDIX A

Front End C-Code Describing the Front End Portion of the Preferred Embodiment

APPENDIX B

Back End C-Code Describing the Back End Portion of the Preferred Embodiment

The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

What is claimed is:

1. The invention claimed is a method for providing information to a digital simulator, that may receive information from an HDL or from other sources such API, GUI, etc. comprising the following:

(a) declaring a variable precision data object, (b) declaring a variable precision descriptor object or a default descriptor, where some of the fields of the descriptor specify the format of the variable precision data object or the size of the fields of the variable precision data object, (c) associating a descriptor to a variable precision data object, (d) setting the fields of the descriptor to appropriate values, and any number of the steps (e) through (i) listed below;

(e) specifying the execution of the computations involving variable precision data objects declared in (a), which have descriptors declared according to (b) associated to them according to (c), with the fields of the descriptors being set according to (d), (f) changing the fields of the descriptor, from within the simulator or using another computer program that accesses the simulation data via an API interface or GUI, during the execution of the simulation, (g) supporting assignments from variable precision data objects to objects of any of the types supported by the simulator, as well as assignments of objects of any of the types supported as variable precision data objects types, is specified without the use of conversion functions and executed by the simulator, (h) evaluating expressions having sub-expressions, by determining the appropriate values for the fields of the descriptors associated to the results of the evaluation of sub-expressions based on the kind of each sub-expression and on the descriptors of the arguments of the given sub-expression, if such descriptors exist, or, in case the arguments have no descriptors, based on the fields of the default descriptor, (i) supporting operators having operands of mixed types, one being of variable precision data object type and the other operand being of one of the types having a fixed size, without needing explicit conversion functions to bring the operands to the same size or format, (j) automatically, associating non-explicitly defined objects and architecture resources information to the variable precision data objects and supporting the capability to read and write said non-explicitly defined objects and information, as well as having said non-explicitly defined objects and information present in the sensitivity list of HDL processes.

2. The invention claimed is the method of claim 1 further including the method for maintaining in implicit objects associated to a particular variable precision data object any of the following information: cumulative error, overflow, underflow, peak number of bits used in holding the integer part of values stored in the variable precision object, number of bits used in holding the fractional part of values stored in the variable precision object.

\* \* \* \* \*